(12) United States Patent
Yoon et al.

(10) Patent No.: US 8,610,655 B2
(45) Date of Patent: Dec. 17, 2013

(54) METHOD FOR REMOVING NOISE, SWITCHING CIRCUIT FOR PERFORMING THE SAME AND DISPLAY DEVICE HAVING THE SWITCHING CIRCUIT

(75) Inventors: Soo-Wan Yoon, Gyeonggi-do (KR); Sung-Hoon Yang, Yongin-si (KR); Chong-Chul Chai, Seoul (KR); So-Woon Kim, Gyeonggi-do (KR); Chang-Hyeon Shin, Suwon-si (KR)

(73) Assignee: Samsung Display Co., Ltd. (KR)

( * ) Notice: Subject to any disclaimer, the term of this patent is extended or adjusted under 35 U.S.C. 154(b) by 1424 days.

(21) Appl. No.: 12/079,830

(22) Filed: Mar. 27, 2008

(65) Prior Publication Data

US 2008/0278214 A1    Nov. 13, 2008

(30) Foreign Application Priority Data

May 10, 2007   (KR) ......................... 10-2007-0045296
Aug. 6, 2007   (KR) ......................... 10-2007-0078419

(51) Int. Cl.
    *G09G 3/36*    (2006.01)
(52) U.S. Cl.
    USPC .......................................................... 345/98

(58) Field of Classification Search
    USPC .............. 345/55, 87, 98–100; 326/62, 63, 80; 327/333, 379
    See application file for complete search history.

(56) References Cited

U.S. PATENT DOCUMENTS

| 5,648,790 A | * | 7/1997 | Lee ................................. 345/58 |
| 6,300,928 B1 | * | 10/2001 | Kim ................................. 345/92 |
| 2001/0011917 A1 | * | 8/2001 | Kim et al. ....................... 327/333 |
| 2006/0197554 A1 | * | 9/2006 | Jinta ................................ 326/81 |

FOREIGN PATENT DOCUMENTS

KR   1020060096297 A   9/2006

\* cited by examiner

*Primary Examiner* — Chanh Nguyen
*Assistant Examiner* — Ram Mistry
(74) *Attorney, Agent, or Firm* — Innovation Counsel LLP

(57) ABSTRACT

A method for removing noise of a gate signal that is outputted from a gate driving circuit including a plurality of stages, the method includes electrically connecting two terminals of two adjacent stages that have noise components opposite in phase to each other during a first period, and electrically disconnecting the two terminals of the two adjacent stages that have the noise components opposite in phase to each other during a second period.

12 Claims, 9 Drawing Sheets

METHOD FOR REMOVING NOISE, SWITCHING CIRCUIT FOR PERFORMING THE SAME AND DISPLAY DEVICE HAVING THE SWITCHING CIRCUIT

CROSS-REFERENCE TO RELATED APPLICATIONS

This application claims priority under 35 U.S.C. §119 to Korean Patent Application No. 10-200745296, filed in the Korean Intellectual Property Office on May 10, 2007, and Korean Patent Application No. 10-2007-78419, filed on Aug. 6, 2007 in the Korean Intellectual Property Office (KIPO), the contents of which are herein incorporated by reference in their entireties.

BACKGROUND OF THE INVENTION

1. Field of the Invention

The present invention relates to a method for removing noise, a switching circuit for performing the method, and a display device having the switching circuit. More particularly, the present invention relates to method for removing noise from a gate signal, a switching circuit for performing the method, and a display device having the switching circuit.

2. Description of the Related Art

In order to decrease the size of a liquid crystal display (LCD) and to increase productivity of manufacturing an LCD, a gate driving circuit is integrated directly on a peripheral area of a display substrate during the manufacturing process of a thin-film transistor (TFT) on the display substrate. Such a gate driving circuit is called an amorphous silicon gate (ASG) driving circuit.

The ASG circuit selects a clock signal having a phase that is continuously changed to output a gate-on signal. Thus, the ASG circuit generates noise caused by the clock signal having the phase that is continuously changed in a gate-off period. In order to decrease the noise, prior art ASG circuits have used various holding sections.

However, when the prior art ASG circuit is operated at a high temperature resulting from being driven for a long time, noise may be generated in the form of an abnormal gate-on signal during the gate-off period. Accordingly, prior art ASG circuits may not effectively control the noise. The noise of the abnormal gate-on signal causes display defects on the LCD.

SUMMARY OF THE INVENTION

Some embodiments of the present invention provide a method capable of removing noise at a high temperature.

The present invention also provides a switching circuit for performing the above-mentioned method.

The present invention also provides a display device having the above-mentioned switching circuit.

In some embodiments of the present invention, a method for removing noise of a gate signal that is outputted from a gate driving circuit including a plurality of stages includes electrically connecting two terminals of adjacent two stages that have noise components opposite in phase to each other during a first period, and electrically disconnecting the two terminals of the adjacent two stages that have the noise components opposite in phase to each other during a second period.

The second period may include a period for a corresponding stage to output the gate signal and a following period for a following stage of the corresponding stage to output a following gate signal.

In accordance with some preferable embodiments of the present invention, the second period includes a period for a corresponding stage to output the gate signal, the following period for the following stage of the corresponding stage to output the following gate signal, and a previous period for a previous stage of the corresponding stage to output a previous gate signal.

In some embodiments of the present invention, a switching circuit includes: a first switching circuit outputting an output signal of a turn-off level through an output terminal; a second switching circuit including a plurality of second switching elements, each of the second switching elements having an input terminal receiving an input signal of the turn-off level, an output terminal connected to the output terminal of the first switching circuit, and a control terminal receiving a control signal; and a third switching circuit including a control terminal connected to the output terminals of the first and second switching circuits, and switching between a first terminal and a second terminal using the control terminal of the third switching circuit, wherein the second switching elements are connected parallel with each other, and are turned on based on the control signals sequentially received through the control terminals of the second switching elements.

In some embodiments of the present invention, a display device includes: a display panel including a display area displaying an image and a peripheral area surrounding the display area, a plurality of pixel areas being formed in the display area, gate lines and data lines crossing the gate lines; a source driving circuit outputting data signals to the data lines; and a gate driving circuit directly integrated in the peripheral area, and outputting gate signals to the gate lines, wherein the gate driving circuit includes: an m-th stage (wherein 'm' is a natural number) including a pull-up section pulling up a first clock signal to a high level to output an m-th gate signal; an (m+1)-th stage connected to the m-th stage, including a pull-up section pulling up a second clock signal opposite in phase to the first clock signal to a high level to output the (m+1)-th gate signal; and a noise removing circuit electrically connecting a control terminal of the pull-up section of the m-th stage and a control terminal of the pull-up section of the (m+1)-th stage, to cancel noise of the control terminal of the pull-up section of the m-th stage and noise of the control terminal of the pull-up section of the (m+1)-th stage.

According to the method for removing the noise, the switching circuit and the display device of the present invention, noise of the gate signal may be decreased. Particularly, the noise of the gate signal at a high temperature may be removed.

BRIEF DESCRIPTION OF THE DRAWINGS

The above and other features and advantages of the present invention will become more apparent in light of the following detailed example embodiments thereof with reference to the accompanying drawings, in which.

DESCRIPTION OF THE EMBODIMENTS

Figure 1:
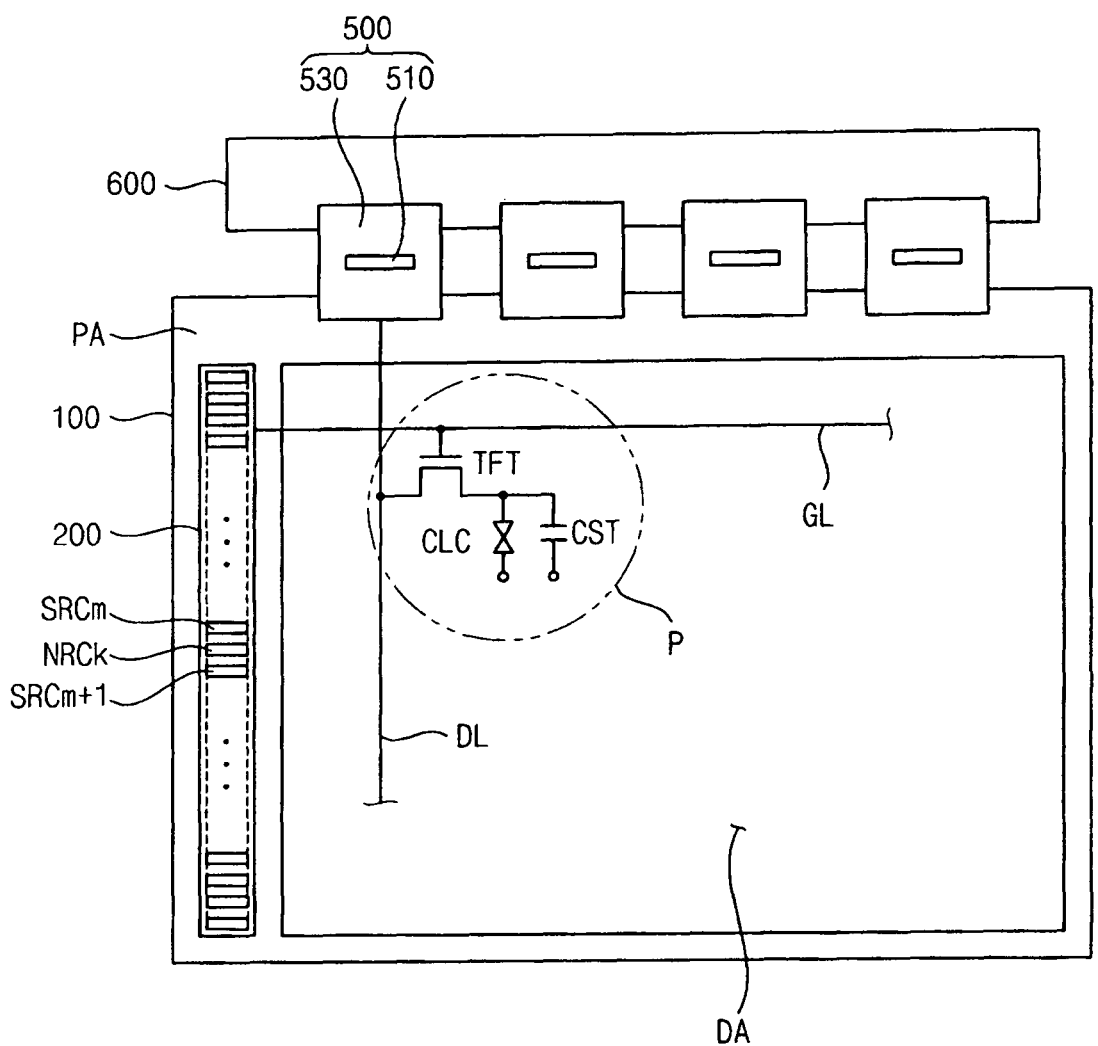
FIG. 1 is a plan view illustrating a display device according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention is explained in detail with reference to the accompanying drawings.

FIG. 1 is a plan view illustrating a display device according to an example embodiment of the present invention.

Referring to FIG. 1, a display device includes a display panel 100, a gate driving circuit 200, a source driving circuit 500, and a printed circuit board (PCB) 600.

The display panel 100 includes a display area DA and a peripheral area PA surrounding the display area DA. The display area DA includes gate lines GL extended in a first direction, data lines DL extended in a second direction crossing the first direction, and a plurality of pixels for displaying an image. Each of the pixels includes a thin-film transistor (TFT) connected to one of the gate lines GL and one of the data lines DL, a liquid crystal capacitor CLC electrically connected to the TFT, and a storage capacitor CST connected parallel to the liquid crystal capacitor CLC.

The gate driving circuit 200 includes a shift register having a plurality of stages sequentially providing gate signals to the gate lines GL and a plurality of switching circuits NRCk for removing noise of the gate signals, wherein 'k' is a natural number. The shift register includes a plurality of stages SRCm and SRCm+1, wherein 'm' is a natural number. A k-th switching circuit NRCk removes noise of an m-th gate signal and an (m+1)-th gate signal that are output signals of an m-th stage SRCm and an (m+1)-th stage SRCm+1. For example, the gate driving circuit 200 may be integrated in the peripheral area PA corresponding to an end of the gate lines GL.

The source driving circuit 500 includes a source driving chip 510 outputting data signals to the data lines DL and a flexible PCB 530 electrically connected to the PCB 600. The source driving chip 410 is mounted on the flexible PCB 530. The source driving chip 410 may be directly mounted on the display panel 100 and directly integrated on the display panel 100.

Figure 2:
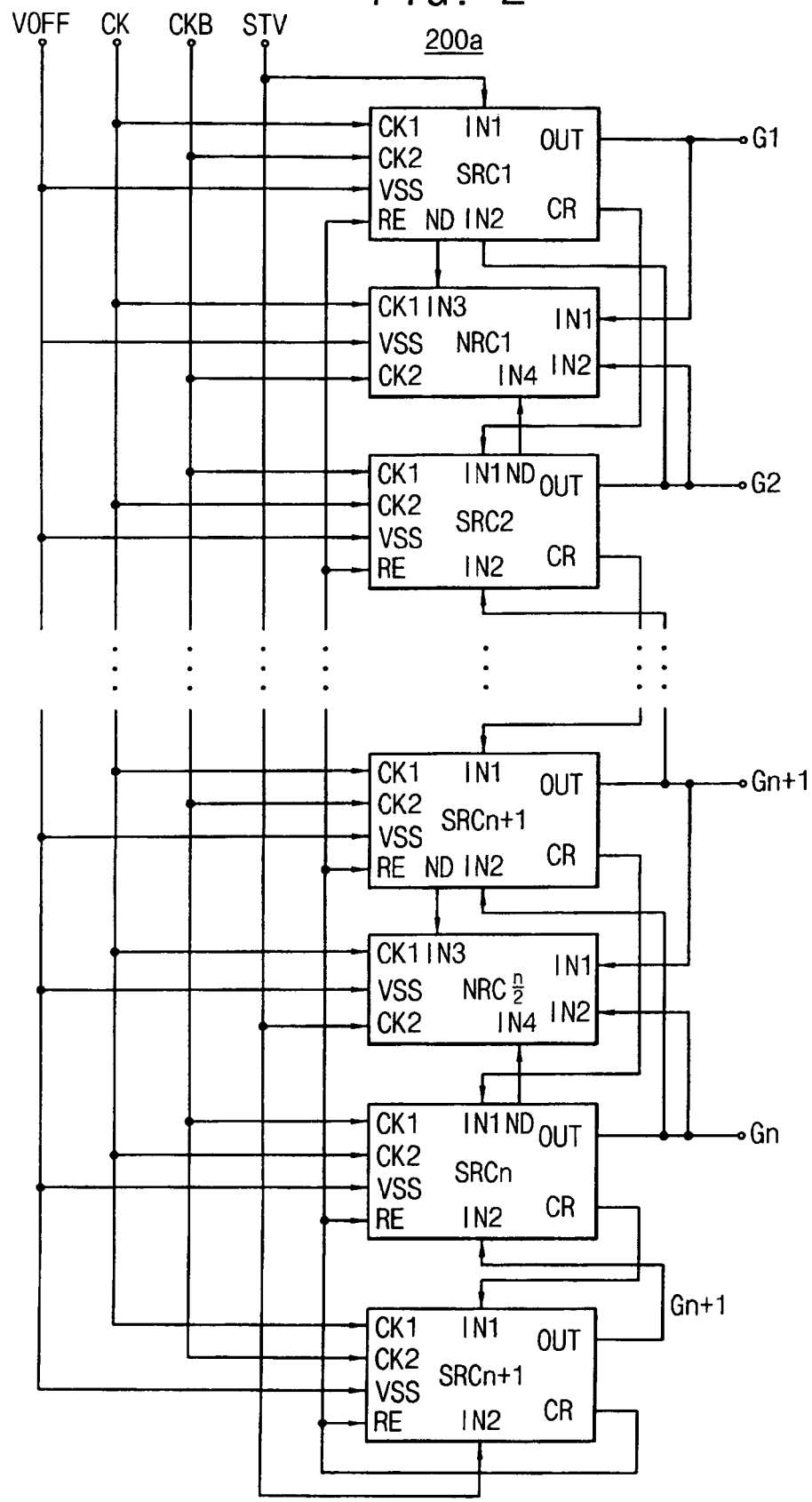
FIG. 2 is a block diagram of a gate driving circuit according to a first embodiment of the present invention.

FIG. 2 is a block diagram of a gate driving circuit 200a according to a first embodiment of the present invention.

Referring to FIG. 2, the gate driving circuit 200a includes a shift register SRC having first to (n+1)-th stages SRC1 to SRCn+1 cascade-connected to each other, and first to (n/2)-th switching circuits connected adjacent to the stages.

The shift register SRC includes the first to n-th stages SRC1 to SRCn outputting n gate signals, and the (n+1)-th stage SRCn+1 outputting a reset signal for resetting the first to n-th stages SRC1 to SRCn. The gate driving circuit 200a includes one dummy stage SRCn+1 for outputting the reset signal. Alternatively, the gate driving circuit 200a may include at least two dummy stages for decreasing a ripple of an n-th gate signal. Each of the first to (n+1)-th stages SRC1 to SRCn+1 includes a first clock terminal CK1, a second clock terminal CK2, a first input terminal IN1, a second input terminal IN2, a voltage terminal VSS, a reset terminal RE, a carry terminal CR, an output terminal OUT and a node terminal ND.

The first clock terminal CK1 of each of the stages SRC (i.e., each of the stages SRC1 to SRCn+1) receives a clock signal opposite in phase to a clock signal at the stage's second clock terminal CK2. For example, odd-numbered stages SRC1, SRC3, etc., may receive a first clock signal CK at their first clock terminals CK1, and receive a second clock signal CKB opposite in phase to the first clock signal CK at their second clock terminals CK2. Even-numbered stages SRC2, SRC4, etc., receive the second clock signal CKB at their first clock terminals CK1, and receive the first clock signal CK opposite in phase to the second clock signal CKB at their second clock terminals CK2.

The first input terminal IN1 of each stage SRC receives either a vertical start signal STV or a carry signal CR of the previous stage. For example, the first input terminal IN1 of the first stage SRC1 may receive the vertical start signal, and the first input terminal IN1 of each of the stages SRC2 to SRCn+1 receives the carry signal of the respective previous stage of the stages SRC1 to SRCn.

The second input terminal IN2 of each stage SRC receives either the gate signal of the following stage or the vertical start signal STV. For example, the second input terminals IN2 of the first to n-th stages SRC1 to SRCn may receive the gate signals of the respective following stages SRC2 to SRCn+1, and the second input terminal IN2 of the final stage SRCn+1 receives the vertical start signal STV.

The voltage terminal VSS of each of the stages receives an off voltage VOFF, and the reset terminal of each of the stages receives the carry signal of the final stage SRCn+1.

The output terminal OUT outputs the gate signal to the gate line electrically connected to the output terminal OUT. When the first clock signal CK is high, the high level of the first clock signal CK is applied to the output terminal OUT of one of the odd-numbered stages SRC1, SRC3, . . . , with the consecutive odd-numbered stages providing the high level of the first clock signal CK in consecutive periods of the first clock signal CK. When the second clock signal CKB is high, the high level of the second clock signal CKB is applied to the output terminal OUT of one of the even-numbered stages SRC2, SRC4, . . . , with the consecutive even-numbered stages providing the high level of the second clock signal CKB in consecutive periods of the second clock signal CKB. In this way, the first to (n+1)-th stages SRC1 to SRCn+1 sequentially output the gate signals of the gate-on voltage level.

The node terminal ND is electrically connected to a first node N1 of each of the stages SRC1 to SRCn+1, and outputs a signal of the first node N1. Each of the first to (n/2)-th switching circuits NRC1 to NRCn/2 receives the signal of the first node N1 outputted from the stages SRC1 to SRCn+1.

The first to (n/2)-th switching circuits NRC1 to NRCn/2 are disposed between the odd-numbered stages SRC1, SRC3, . . . , and the even-numbered stages SRC2, SRC4, . . . . For example, a first switching circuit NRC1 may be disposed between the first stage SRC1 and the second stage SRC2. In the same method, a second switching circuit NRC2 is disposed between the third stage SRC3 and the fourth stage SRC4.

Each of the first to (n/2)-th switching circuits NRC1 to NRCn/2 includes a first clock terminal CK1, a second clock terminal CK2, a first input terminal IN1, a second input terminal IN2, a third input terminal IN3, a fourth input terminal IN4 and a voltage terminal VSS.

The first clock terminal CK1 receives the first clock signal CK, and the second clock terminal CK2 receives the second clock signal CKB. The first input terminal IN1 is connected to the output terminal OUT of each of the odd-numbered stages SRC1, SRC3, . . . , to receive each of the odd-numbered gate signals. The second input terminal IN2 is connected to the output terminal OUT of each of the even-numbered stages SRC2, SRC4, . . . , to receive each of the even-numbered gate signals.

The third input terminal IN3 is connected to the node terminal ND of each of the odd-numbered stages SRC1, SRC3, . . . , to receive the signal of the first node N1 of each of the odd-numbered stages SRC1, SRC3, . . . .

The fourth input terminal IN4 is connected to the node terminal ND of each of the even-numbered stages SRC2, SRC4, . . . , to receive the signal of the first node N1 of each of the even-numbered stages SRC2, SRC4, . . . .

The voltage terminal VSS receives the off voltage VOFF.

Figure 3:
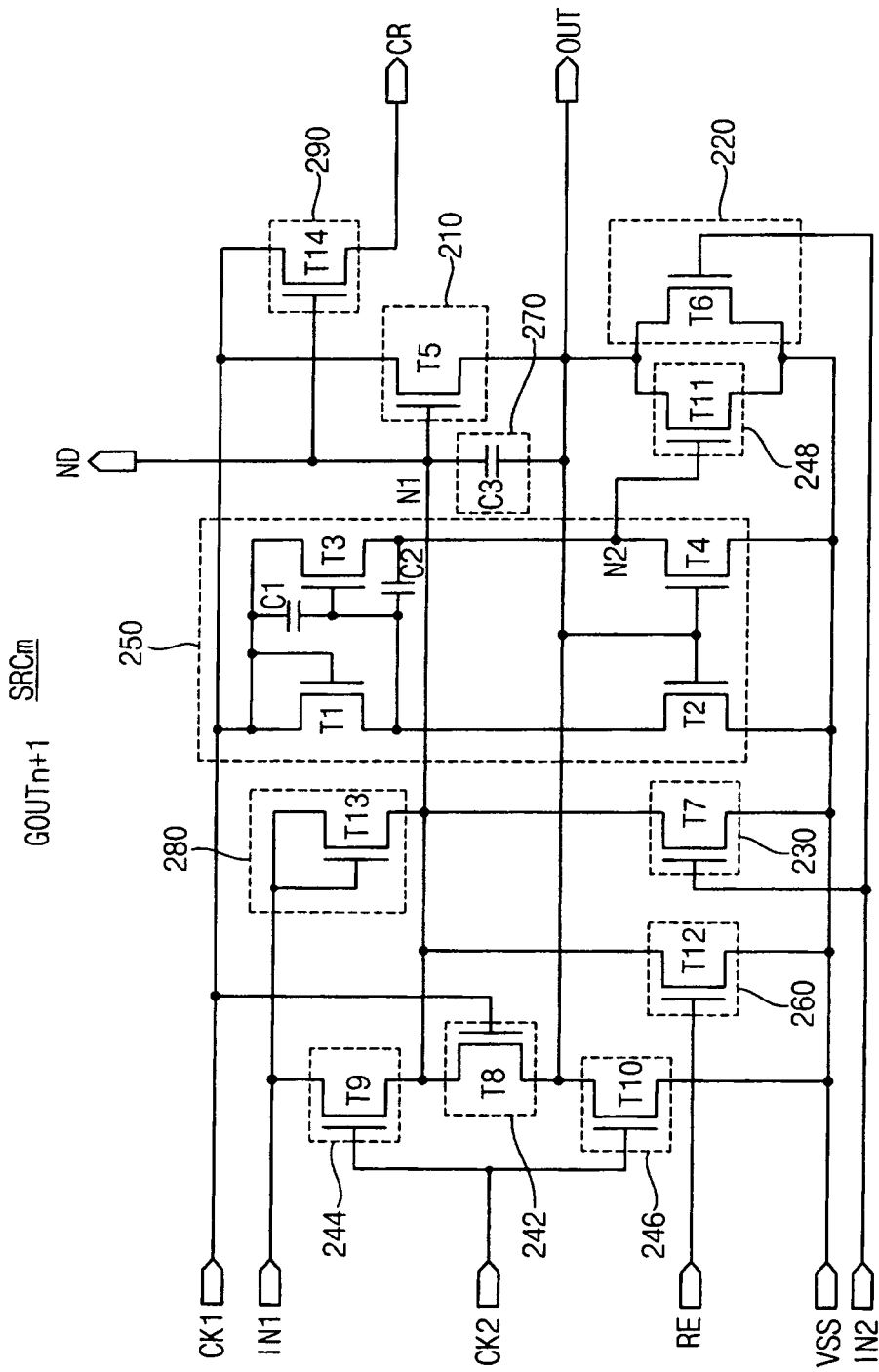
FIG. 3 is a schematic circuit diagram illustrating a stage of the gate driving circuit shown in FIG. 2.
Figure 4:
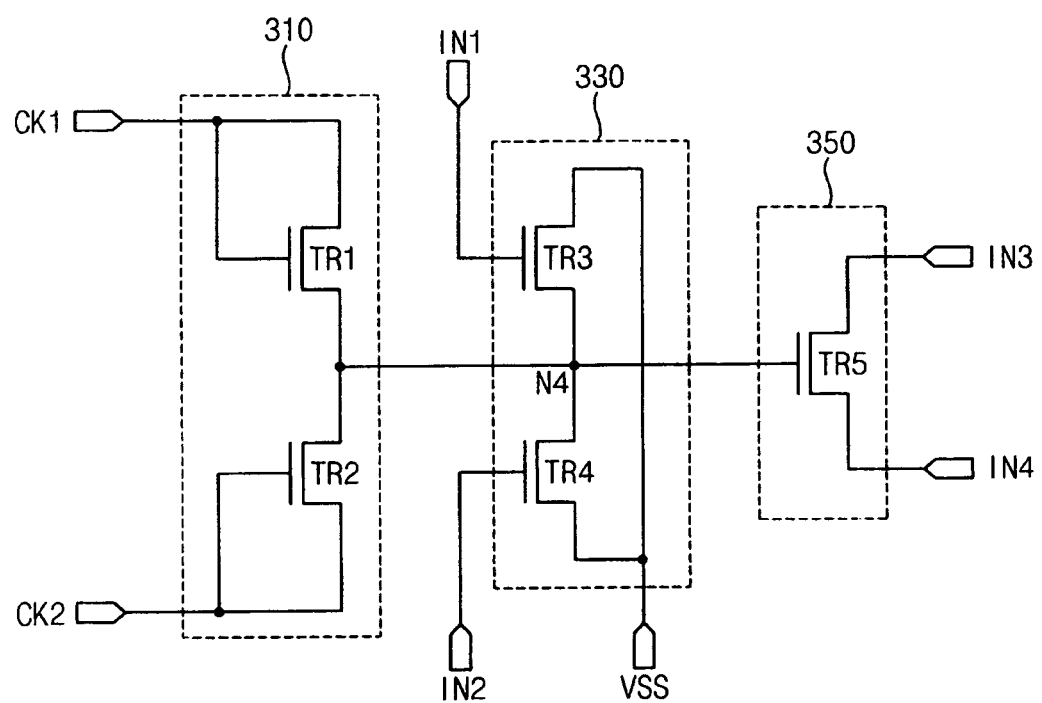
FIG. 4 is a schematic circuit diagram illustrating a switching circuit used in the driving circuit of FIG. 2.
Figure 5:
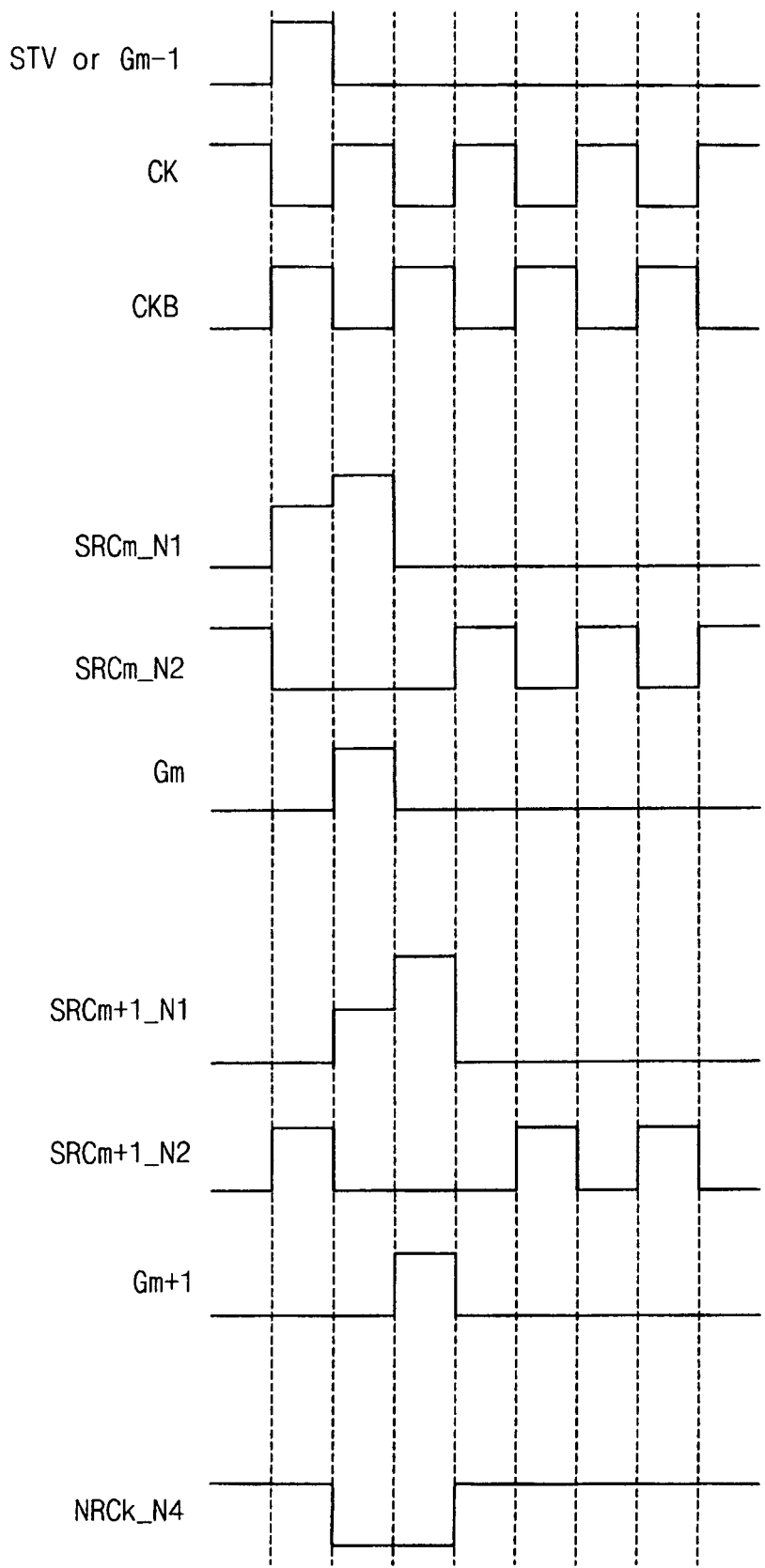
FIG. 5 is a timing diagram of signals of the gate driving circuit in FIG. 2.

FIG. 3 is a schematic circuit diagram illustrating a stage of the gate driving circuit 200a shown in FIG. 2. FIG. 4 is a schematic circuit diagram illustrating a switching circuit used in gate driving circuit 200a shown in FIG. 2. FIG. 5 is a timing diagram of signals of the gate driving circuit in FIG. 2.

Referring to FIGS. 3 and 5, an m-th stage SRCm includes a pull-up section 210 and the pull-down section 220. The pull-up section 210 pulls up the m-th gate signal Gm to the high level of the first clock signal CK in response to the carry signal of the (m−1)-th stage SRCm−1. The pull-down section 220 pulls down the pulled up m-th gate signal Gm to the off voltage VOFF in response to the (m+1)-th gate signal Gm+1 of the (m+1)-th stage SRCm+1.

The pull-up section 210 includes a fifth transistor T5 having a gate electrode connected to the first node N1, a drain electrode connected to the first clock terminal CK1, and a source electrode connected to the output terminal OUT.

The pull-down section 220 includes a sixth transistor T6 having a gate electrode connected to the second input terminal IN2, a drain electrode connected to the output terminal OUT, and a source electrode connected to the voltage terminal VSS.

The m-th stage SRCm further includes a pull-up driving section (not shown) turning on the pull-up section 210 in response to the carry signal of the (m−1)-th stage SRCm−1, and turning off the pull-up section 210 in response to the (m+1)-th gate signal of the (m+1)-th stage SRCm+1. The pull-up driving section may include a buffer section 280, a charging section 270 and a discharging section 230.

The buffer section 280 includes a thirteenth transistor T13 having a gate electrode connected to the first input terminal IN1, a drain electrode connected to the first input terminal IN1, and a source electrode connected to the first node N1. The charging section 270 includes a third capacitor C3 having a first electrode connected to the first node N1 and a second electrode connected to the output terminal OUT. The discharging section 230 includes a seventh transistor T7 having a gate electrode connected to the second input terminal IN2, a drain electrode connected to the first node N1, and a source electrode connected to the voltage terminal VSS. The off voltage VOFF is applied to the source electrode of the seventh transistor T7.

When the thirteenth transistor T13 is turned on in response to the carry signal of the (m−1)-th stage, the carry signal of the (m−1)-th stage SRCm−1 is applied to the first node N1 to change the first node N1 to a high level, and the carry signal of the (m−1)-th stage SRCm−1 charges the third capacitor C3 at substantially the same time.

When the third capacitor C3 is charged by a voltage greater than the threshold voltage of the fifth transistor T5 and the first clock terminal CK1 becomes the high level, the fifth transistor T5 is bootstrapped to output the high level of the first clock signal CK through the output terminal OUT. That is, the output signal of the m-th stage SRCm is the m-th gate signal Gm.

When the seventh transistor T7 is turned on in response to the (m+1)-th gate signal Gm+1, the third capacitor C3 is discharged to the off voltage VOFF of the voltage terminal VSS, so that the fifth transistor T5 is turned off.

The m-th stage SRCm may further include a first holding section 242 stably maintaining the first node N1 at the off voltage VOFF during a disable period. The first holding section 242 may stably maintain the off voltage VOFF of first node N1 discharged by the discharging section 230 independent from the ripple of the first and second clock signals CK and CKB to before an enable period of the next frame.

For example, the first clock signal CK may swing between the high level and the low level during the disable period, so that the ripple may be generated at the first node N1 by a coupling capacitance between the drain electrode of the fourth transistor T4 and the gate electrode of the fourteenth T14. In order to control the ripple, the first holding section 242 includes an eighth transistor T18 having a gate electrode connected to the first clock terminal CK1, a drain electrode connected to the first node N1 and a source electrode connected to the output terminal OUT.

When the first clock signal CK has the high level, the eighth transistor T8 is turned on, and the first node N1 is connected to the third node N3 having the off voltage VOFF to stably maintain the level of the off voltage VOFF at the first node N1. When the first clock signal CK has the low level, the ripple of the first node N1 by the coupling capacitance is negligible, so that controlling the level of the voltage applied to the first node N1 is not required.

In an enable period of the m-th stage SRCm, that is, when the first node N1 has the high level, the first clock signal CK has the low level. The eighth transistor T8 is turned off and the first node N1 becomes the high level due to the high level of the carry signal received from the first input terminal IN1.

When the eighth transistor T8 is turned on in response to the first clock signal CK of the high level, the third node N3 becomes the high level. Thus, the first node N1 maintains the high level. The third node N3 is described hereafter.

After the second holding section 244 discharges the carry signal of the (m−1)-th stage SRCm−1 having the high level and the first input terminal IN1 of the m-th stage SRCm to the off voltage VOFF, the second holding section 244 may stably maintain the off voltage VOFF during the disable period of the m-th stage SRCm. The carry terminal CR of the (m−1)-th stage SRCm−1 that is the previous stage and the first input terminal IN1 of the m-th stage SRCm output the signal having the high level. When a ninth transistor T9 is turned on in response to the second clock signal CKB of the high level, the carry terminal CR of the (m−1)-th stage SRCm−1 and the first input terminal IN1 of the m-th stage SRCm connected to the first node N1 are discharged to the off voltage VOFF.

In the disable period, when the second clock signal CKB becomes the high level, the carry terminal CR of the (m−1)-th stage SRCm−1 and the first input terminal IN1 of the m-th stage SRCm connected to the first node N1 may stably maintain the off voltage VOFF.

Therefore, each of the first and second holding sections 242 and 244 are sequentially turned on in response to the signals at the respective first and second clock terminals CK1 and CK2, so that the first node N1, the carry terminal CR of the (m−1)-th stage SRCm−1 and the first input terminal IN1 of the m-th stage SRCm may stably maintain the off voltage VOFF.

The m-th stage SRCm may further include a third holding section 246, a fourth holding section 248, and a switching section 250. The third and fourth holding sections 246 and 248 maintain the m-th gate signal Gm at the off voltage VOFF independent from the ripple of the first and second clock signals CK and CKB after the third node N3 becomes the off voltage VOFF by the pull-down section 220 and before the gate signal of the next frame is outputted. The switching section 250 controls on/off switching of the fourth holding section 248.

The third holding section 246 includes a tenth transistor T10 having a gate electrode connected to the second clock terminal CK2, a drain electrode connected to the output terminal OUT, and a source electrode connected to the voltage terminal V. The source electrode of the tenth transistor T10 receives the off voltage VOFF. The fourth holding section 248 includes an eleventh transistor T11 having a gate electrode connected to the second node N2 of the switching section 250, a drain electrode connected to the output terminal OUT, and a source electrode connected to the voltage terminal VSS. The source electrode of the eleventh transistor T11 receives the off voltage VOFF.

The switching section 250 includes first, second, third and fourth transistors T1, T2, T3 and T4, respectively, and first and second capacitors C1 and C2.

The first transistor T1 has a gate electrode connected to the first clock terminal CK1, a drain electrode connected to the first clock terminal CK1, and a source electrode connected to a drain electrode of the second transistor T2. The gate and drain electrodes receive the signal at the first clock terminal CK1. The second transistor T2 has a gate electrode connected to the output terminal OUT, and a source electrode connected to the voltage terminal VSS to receive the off voltage VOFF. The third transistor T3 has a drain electrode connected to the first clock terminal CK1, a gate electrode connected to the first clock terminal CK1 through the capacitor C1, and a source electrode connected to the second node N2.

Therefore, the drain and gate electrodes of the third transistor T3 receive the signal at the first clock terminal CK1. The second capacitor C2 is connected between the gate and source electrodes of the third transistor T3. The fourth transistor T4 has a gate electrode connected to the output terminal OUT, a drain electrode connected to the second node N2, and a source electrode connected to the voltage terminal V to receive the off voltage VOFF.

When the m-th stage SRCm outputs the m-th gate signal Gm using the high level of the first clock signal CK through the output terminal OUT, the second and fourth transistors T2 and T4 are turned on. Thus the second node N2 is applied to the off voltage VOFF.

The first and third transistors T1 and T3 are turned on in response to the first clock signal having the high level, and a gate electrode of the eleventh transistor T11 is applied to a divided voltage that is a voltage between a voltage of first clock signal CK and the off voltage VOFF. The divided voltage is proportional to a resistance ratio of the third and fourth transistors T3 and T4

When the divided voltage is lower than the threshold voltage of the eleventh transistor T11, the eleventh transistor T11 maintains a turn-off state. Thus, third node N3 may maintain the high level.

When the second input terminal IN2 receives the (m+1)-th gate signal Gm+1 of the high level after 1 H (H: horizontal period) has passed, the sixth transistor T6 is turned on. Thus, the third node N3 is discharged to the off voltage VOFF and the second and the fourth transistors T2 and T4 are turned off. At substantially the same time, the tenth transistor T10 is turned on in response to the second clock signal CKB having the high level, and the third node N3 is quickly pulled down to the off voltage VOFF.

The third and fourth holding sections 246 and 248 are sequentially turned on in response to the first and second clock signals CK and CKB to maintain the third node N3 at the off voltage VOFF during one frame except for a period for outputting the m-th and (m+1)-th gate signals Gm and Gm+1.

The m-th stage of the gate driving circuit 200 may further include a reset section 260 and a carry section 290.

The reset section 260 includes a twelfth transistor T12 having a gate electrode connected to the reset terminal RE, a drain electrode connected to the first node N1, and a source electrode connected to the voltage terminal V to receive the off voltage VOFF.

The reset terminal RE of the reset section 260 receives the carry signal of the final stage SRCn+1, and resets the first node N1 at the off voltage VOFF. The third node N3 of the (n+1)-th stage SRCn+1 is not reset before a vertical start signal STV of the next frame is applied to the second input terminal IN2 of the stage SRCn+1. Thus, during a blanking period of one frame, the first node N1 is stabilized at the off voltage VOFF.

The carry section 290 includes a fourteenth transistor T14 having a gate electrode connected to the first node N1, a drain electrode connected to the first clock terminal CK1 (to receive the first clock signal CK for example), and a source electrode connected to the carry terminal CR. The carry section 290 outputs the first clock signal CK of the high level to the carry terminal CR when the voltage of the first node N1 becomes high.

Hereinafter, the carry signal outputted from the carry section 290 is applied to the first input terminal IN1 of the next stage to control a driving timing of the next stage. However, the carry section 290 may be omitted, and the gate signal outputted from the output terminal OUT may be applied to the first input terminal IN1 of the next stage.

A load on a gate line of a high-resolution panel of XGA or higher resolution or a large-screen panel is greater than that on a low-resolution or a small-screen panel. Thus, when the gate signal is used as the carry signal, the lower end of the panel may be not driven by the delay of the carry signal. In the example embodiment of the present invention, the stage circuit of a high-resolution panel of XGA or higher resolution or a large-screen panel includes the carry section 290.

After the carry section 290 outputs the carry signal having the high level through the carry terminal CR, the carry terminal CR of the high level is discharged to the off voltage VOFF, and the carry terminal CR is maintained to be the off voltage VOFF during the disable period of the m-th stage SRCm.

As mentioned above, the m-th stage SRCm includes the holding section 242 for removing the noise of the first node N1, but the entirety of the noise may not be completely removed. For example, when the transistor is driven at a high temperature, a leakage current of the transistor may be increased, and thus the noise may not be completely removed.

Hereafter, a switching circuit for removing the noise will be explained.

Referring to FIGS. 4 and 5, a k-th noise removing circuit 300 includes a first switching circuit 310, a second switching circuit 330, and a third switching circuit 350.

The first switching circuit 310 outputs an output signal of the high level through an output terminal. For example, the first switching circuit 310 may include a first switching element TR1 outputting a high level of the first clock signal CK in response to the high level of the first clock signal CK, and a second switching element TR2 outputting a high level of the second clock signal CKB in response to the high level of the second clock signal CKB.

For example, the first switching element TR1 may include a gate electrode connected to first clock terminal CK1, a source electrode connected to the first clock terminal CK1 and a drain electrode connected to a fourth node N4. The second switching element TR2 includes a gate electrode connected to a second clock terminal CK2, a source electrode connected to a second clock terminal CK2 and a drain electrode connected to a fourth node N4.

The second switching circuit 330 includes an input terminal that receives an input signal of a low level, an output terminal N4 connected to an output terminal O1 of the first switching circuit 310, and a plurality of control terminals sequentially receiving a plurality of control signals. The control terminals are connected to first input terminal IN1 and to a second input terminal IN2.

For example, the second switching circuit 330 may include a third switching element TR3 and a fourth switching element TR4. The third switching element TR3 discharges the first clock signal CK of the high level to the off voltage VOFF in response to the high level of the m-th gate signal Gm that is outputted from the m-th stage SRCm. The fourth switching element TR4 discharges the second clock signal CKB of the high level to the off voltage VOFF in response to the high level of the (m+1)-th gate signal Gm+1 that is outputted from the (m+1)-th stage SRCm+1.

For example, the third switching element TR3 may include a gate electrode connected to the first input terminal IN1, a source electrode connected to the fourth node N4, and a drain electrode connected to a voltage terminal VSS. The fourth switching element TR4 includes a gate electrode connected to the second input terminal IN2, a source electrode connected to the fourth node N4 and a drain electrode connected to the voltage terminal VSS.

The third switching circuit 350 switches between a first terminal and a second terminal based on a signal received from a control terminal connected to the output terminals of the first and the second switching circuits 310 and 330. The first terminal is connected to the control terminal of the pull-up section of the m-th stage SRCm. The second terminal is connected to the control terminal of the pull-up section of the (m+1)-th stage SRCm+1.

For example, the third switching circuit 350 may include a fifth switching element TR5. When the third or fourth switching element TR3 or TR4 is turned on, the fifth switching element TR5 electrically connects between the control terminal of the pull-up section of the m-th stage SRCm and the control terminal of the pull-up section of the (m+1)-th stage SRCm+1 in response to the off voltage VOFF. When the third or fourth switching element TR3 or TR4 is turned off, the fifth switching element TR5 electrically disconnects between the control terminal of the pull-up section of the m-th stage SRCm and the control terminal of the pull-up section of the (m+1)-th stage SRCm+1 in response to the first or second clock signal CK or CKB having the high level.

Referring to FIG. 3, the control terminal of the pull-up section of the m-th stage SRCm is the first node N1 of the m-th stage SRCm, and the control terminal of the pull-up section of the (m+1)-th stage SRCm+1 is the first node N1 of the (m+1)-th stage SRCm+1.

For example, the fifth switching element TR5 may include a gate electrode connected to the fourth node N4, a source electrode connected to a third input terminal IN3 received a signal of the first node N1 of the m-th stage SRCm, and a drain electrode connected to a fourth input terminal IN4 received a signal of the first node N1 of the (m+1)-th stage SRCm+1. That is, the fifth switching element TR5 electrically connects or disconnects between the first node N1 of the m-th stage SRCm and the first node N1 of the (m+1)-th stage SRCm+1.

A method of driving the k-th noise removing circuit 300 is as follows.

When the first input terminal IN1 receives the m-th gate signal Gm, the third switching element TR3 is turned on. Thus, the off voltage VOFF received from the voltage terminal VSS is applied to the fourth node N4. When the fourth node N4 has the off voltage VOFF, the fifth switching element TR5 is turned off. Thus, the first node N1 of the m-th stage SRCm and the first node N1 of the (m+1)-th stage SRCm+1 are electrically disconnected from each other.

When the second input terminal IN2 receives the (m+1)-th gate signal Gm+1, the fourth switching element TR4 is turned on. Thus, the off voltage VOFF received from the voltage terminal VSS is applied to the fourth node N4. When the fourth node N4 has the off voltage VOFF, the fifth switching element TR5 is turned off. Thus, the first node N1 of the m-th stage SRCm and the first node N1 of the (m+1)-th stage SRCm+1 are electrically disconnected from each other.

That is, while the first and second input terminals IN1 and IN2 receive the m-th gate signal Gm and the (m+1)-th gate signal Gm+1, the first node N1 of the m-th stage SRCm and the first node N1 of the (m+1)-th stage SRCm+1 are electrically disconnected from each other.

In addition, while the first and second input terminals IN1 and IN2 do not receive the m-th gate signal Gm and the (m+1)-th gate signal Gm+1, the first and 10 second clock terminals CK1 and CK2 alternately receive the first and second clock signals CK and CKB.

When the first clock terminal CK1 receives the first clock signal CK of the high level, the first switching element TR1 is turned on. Thus, the fourth node N4 has the high level of the first clock signal CK, so that the fifth switching element TR5 is turned on. Thus, the first node N1 of the m-th stage SRCm and the first node N1 of the (m+1)-th stage SRCm+1 are electrically connected with each other.

In addition, when the first terminal CK1 receives the first clock of the low level and the second clock terminal CK2 receives the second clock signal CKB of the high level, the second switching element TR2 is turned on. Thus, the fourth node N4 has the high level of the first clock signal CK, so that the fifth switching element TR5 is turned on. Thus, the first node N1 of the m-th stage SRCm and the first node N1 of the (m+1)-th stage SRCm+1 are electrically connected with each other.

While the first and second input terminals IN1 and IN2 receive the m-th gate signal Gm and the (m+1)-th gate signal Gm+1, the first and second clock terminals CK1 and CK2 also receive the first and second clock signals CK and CKB. Though the first and second switching elements TR1 and TR2 are turned on in response to the first and second clock signals CK and CKB, the third and fourth switching elements TR3 and TR4 are turned on. The fourth node N4 has the off voltage VOFF, so that the first node N1 of the m-th stage SRCm and the first node N1 of the (m+1)-th stage SRCm+1 are electrically disconnected from each other.

In addition, while the first and second input terminals IN1 and IN2 receive the low level of the m-th gate signal Gm and the (m+1)-th gate signal Gm+1, the first node N1 of the m-th stage SRCm and the first node N1 of the (m+1)-th stage SRCm+1 are electrically connected by the high level of the first and second clock signals CK and CKB.

Accordingly, during one frame when the m-th and the (m+1)-th stages SRCm and SRCm+1 output the low level of the m-th and (m+1)-th gate signals Gm and Gm+1, the first node N1 of the m-th stage SRCm and the first node N1 of the (m+1)-th stage SRCm+1 are electrically connected. Thus, the noise components generated at the first node N1 of the m-th stage SRCm and the first node N1 of the (m+1)-th stage SRCm+1 may interfere with and cancel out each other.

Figure 6:
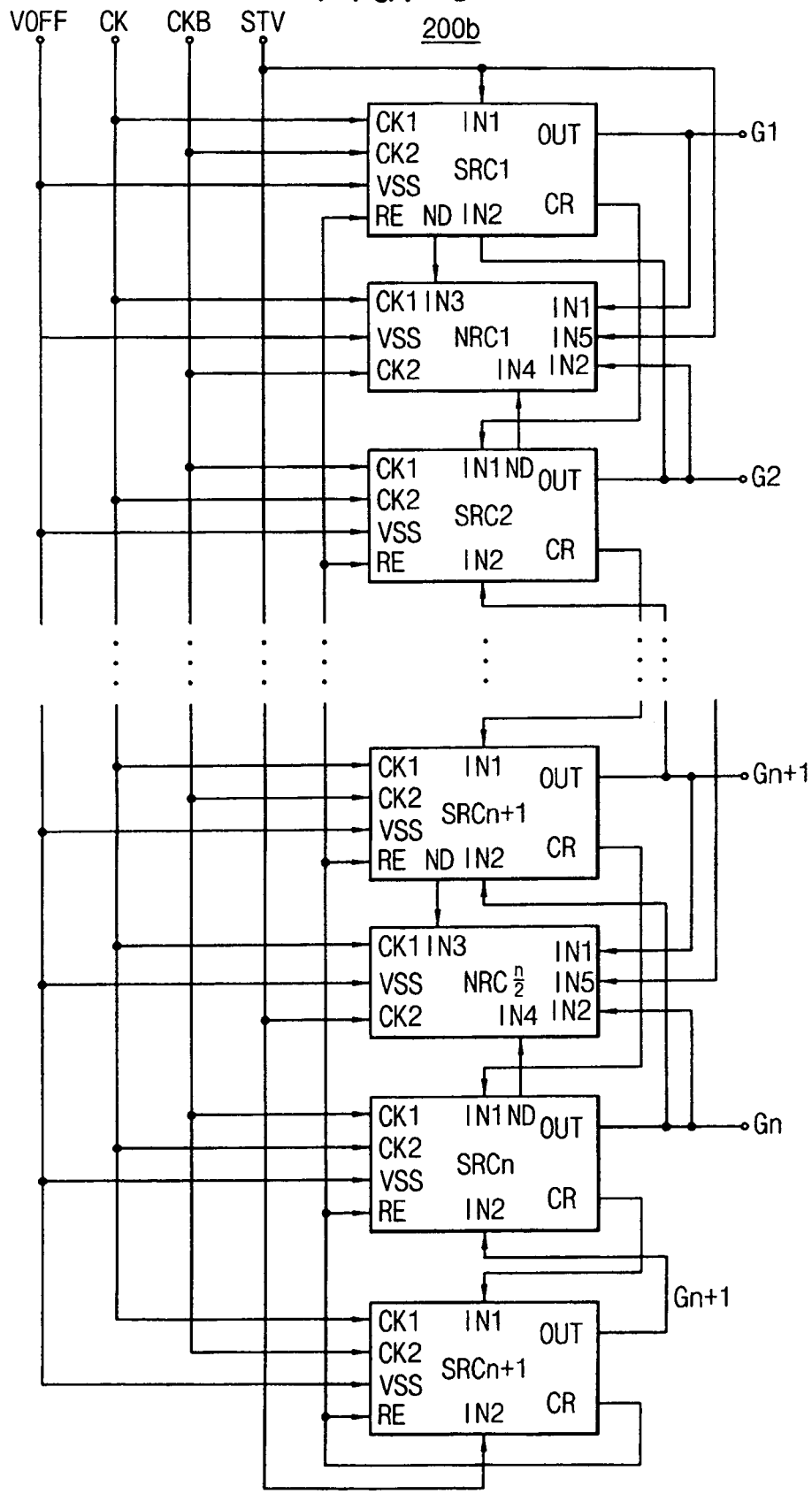
FIG. 6 is a block diagram of a gate driving circuit according to a second embodiment of the present invention.
Figure 7:
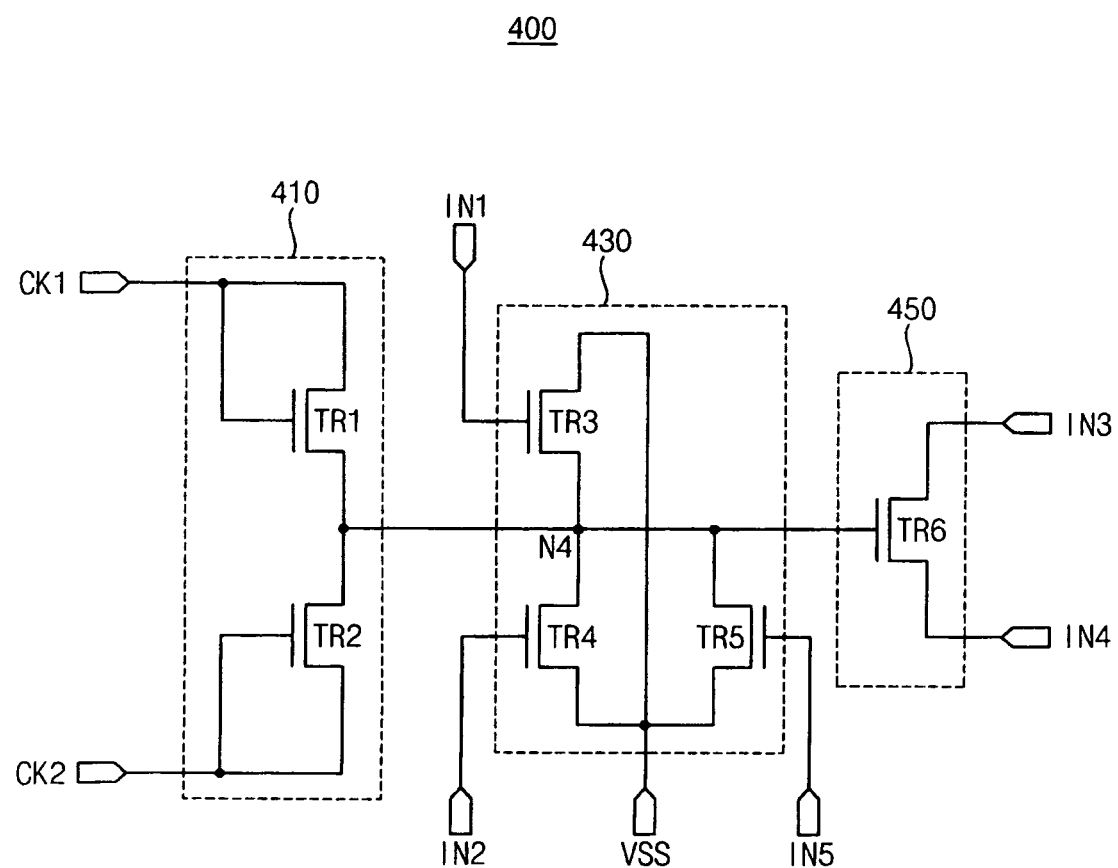
FIG. 7 is a schematic circuit diagram illustrating a switching circuit used in the gate driving circuit shown in FIG. 6.
Figure 8:
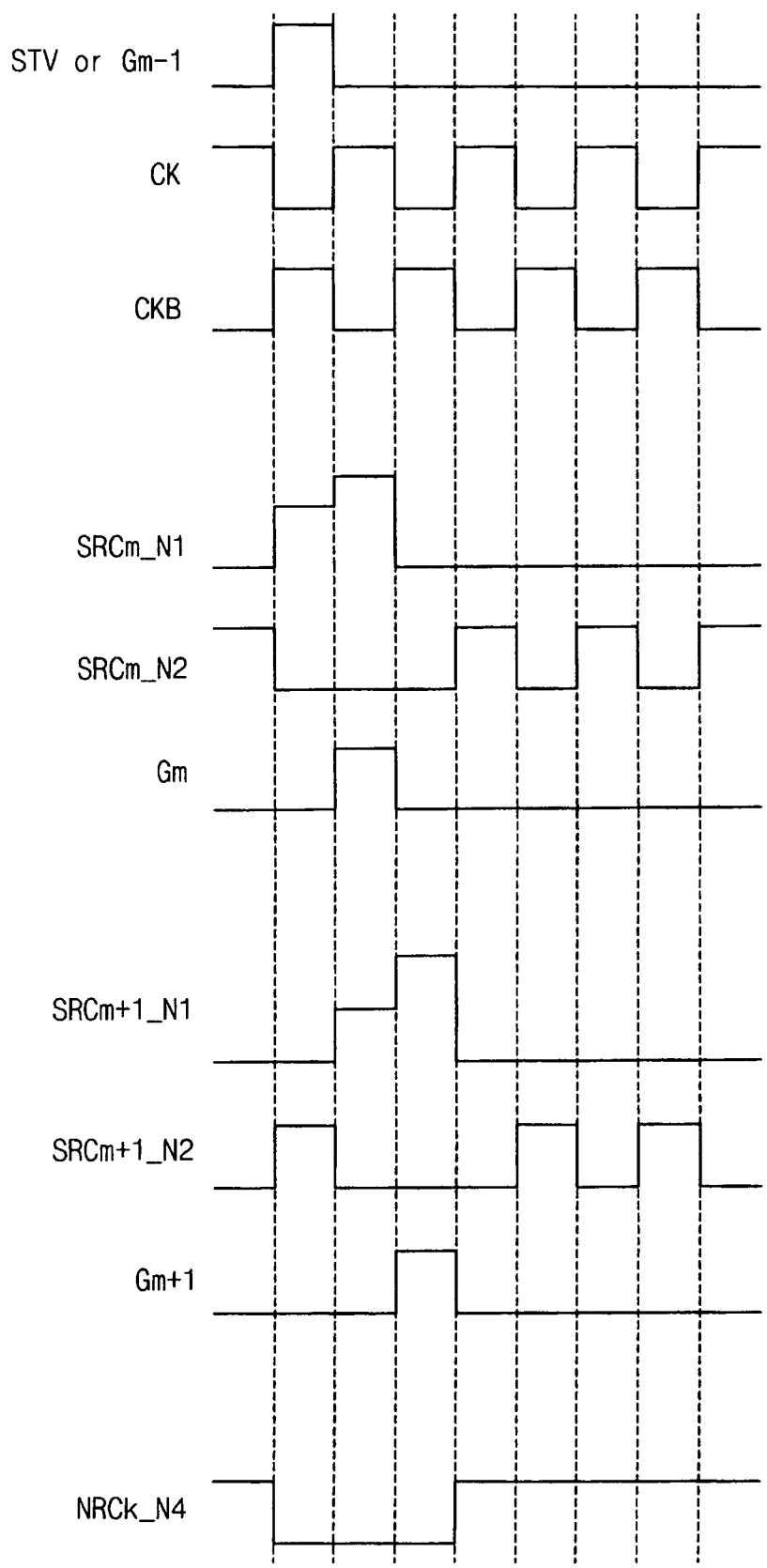
FIG. 8 is a timing diagram of signals of the gate driving circuit in FIG. 6.

FIG. 6 is a block diagram of a gate driving circuit according to a second example embodiment of the present invention. FIG. 7 is a schematic circuit diagram illustrating a switching circuit in FIG. 6. FIG. 8 is a timing diagram of signals of the gate driving circuit in FIG. 6.

Referring to FIG. 6, the gate driving circuit 200b includes a shift register SRC having first to (n+1)-th stages SRC1 to SRCn+1 cascade-connected together, and first to (n/2)-th switching circuits connected adjacent to the stages.

The shift register SRC is substantially the same as the gate driving circuit 200a described in FIG. 2, and any repetitive explanation concerning the above elements will be omitted.

Each of the first to (n/2)-th switching circuits NRC1 to NRCn/2 includes a first clock terminal CK1, a second clock terminal CK2, a first input terminal IN1, a second input terminal IN2, a third input terminal IN3, a fourth input terminal IN4, a fifth input terminal IN5, and a voltage terminal VSS.

The first clock terminal CK1 receives the first clock signal CK, and the second clock terminal CK2 receives the second clock signal CKB. The first input terminal IN1 is connected to the output terminal OUT of the stage adjacent to the switching circuit among the odd-numbered stages SRC1, SRC3, . . . , to receive the gate signal outputted from a corresponding stage among the odd-numbered stages SRC1, SRC3, . . . . The second input terminal IN2 is connected to the output terminal OUT of the stage adjacent to the switching circuit among the even-numbered stages SRC2, SRC4, . . . , to receive the gate signal outputted from a corresponding stage among the even-numbered stages SRC2, SRC4, . . . .

The third input terminal IN3 is connected to the node terminal ND of the stage adjacent to the switching circuit among the odd-numbered stages SRC1, SRC3, . . . , to receive the signal of the first node N1 of a corresponding stage among the odd-numbered stages SRC1, SRC3, . . . . The fourth input terminal IN4 is connected to the node terminal ND of the stage adjacent to the switching circuit among the even-numbered stages SRC2, SRC4, . . . , to receive the signal of the first node N1 of a corresponding stage among the even-numbered stages SRC2, SRC4, . . . . The fifth input terminal IN5 is connected to a previous stage that is disposed in front of the odd-numbered stage outputting the signal applied to the first input stage IN1, to receive the output signal of the previous stage. The previous stage is one among the even-numbered stages SRC2, SRC4, . . . , and the fifth input terminal IN5 of the first switching circuit NRC1 receives the vertical start signal STV.

The voltage terminal VSS receives the off voltage VOFF.

Referring to FIGS. 7 and 8, a k-th noise removing circuit 400 includes a first switching circuit 410, a second switching circuit 430, and a third switching circuit 450.

The first switching circuit 410 includes a first switching element TR1 outputting a high level of the first clock signal CK in response to the high level of the first clock signal CK, and a second switching element TR2 outputting a high level of the second clock signal CKB in response to the high level of the second clock signal CKB.

For example, the first switching element TR1 may include a gate electrode connected to first clock terminal CK1, a source electrode connected to the first clock terminal CK1 and a drain electrode connected to a fourth node N4. The second switching element TR2 may include a gate electrode connected to a second clock terminal CK2, a source electrode connected to a second clock terminal CK2 and a drain electrode connected to a fourth node N4.

The second switching circuit 430 includes a third switching element TR3, a fourth switching element TR4 and a fifth switching element TR5. The third switching element TR3 applies the off voltage VOFF to the fourth node N4 in response to the high level of the m-th gate signal Gm that is outputted from the m-th stage SRCm. The fourth switching element TR4 applies the off voltage VOFF to the fourth node N4 in response to the high level of the (m+1)-th gate signal Gm+1 that is outputted from the (m+1)-th stage SRCm+1. The fifth switching element TR5 applies the off voltage VOFF to the fourth node N4 in response to the high level of the (m−1)-th gate signal Gm−1 that is outputted from the (m−1)-th stage SRCm−1.

For example, the third switching element TR3 may include a gate electrode connected to the first input terminal IN1, a source electrode connected to the fourth node N4, and a drain electrode connected to a voltage terminal VSS. The fourth switching element TR4 may include a gate electrode connected to the second input terminal IN2, a source electrode connected to the fourth node N4 and a drain electrode connected to the voltage terminal VSS. The fifth switching element TR5 may include a gate electrode connected to the fifth input terminal IN5, a source electrode connected to the fourth node N4 and a drain electrode connected to the voltage terminal VSS.

The third switching circuit 450 includes a sixth switching element TR6. When the third, fourth or fifth switching element TR3, TR4 or TR5 is turned on, the gate electrode of the sixth switching element TR6 is applied to the off voltage VOFF. Thus, the sixth switching element TR6 electrically disconnects between the control terminal of the pull-up section of the m-th stage SRCm and the control terminal of the pull-up section of the (m+1)-th stage SRCm+1 in response to the off voltage VOFF.

When the third, fourth or fifth switching element TR3, TR4 or TR4 is turned off, the gate electrode of the sixth switching element TR6 is applied to the first or second clock signal CK or CKB having the high level. Thus, the sixth switching element TR6 electrically connects between the control terminal of the pull-up section of the m-th stage SRCm and the control terminal of the pull-up section of the (m+1)-th stage SRCm+1 in response to the first or second clock signal CK or CKB having the high level. The control terminal of the pull-up section of the m-th stage SRCm is the first node N1 of the m-th stage SRCm, and the control terminal of the pull-up section of the (m+1)-th stage SRCm+1 is the first node N1 of the (m+1)-th stage SRCm+1.

For example, the sixth switching element TR6 includes a gate electrode connected to the fourth node N4, a source electrode connected to a third input terminal IN3 received a signal of the first node N1 of the m-th stage SRCm, and a drain electrode connected to a fourth input terminal IN4 received a signal of the first node N1 of the (m+1)-th stage SRCm+1. That is, the sixth switching element TR6 electrically disconnects or connects between the first node N1 of the m-th stage SRCm and the first node N1 of the (m+1)-th stage SRCm+1.

A method of driving the k-th noise removing circuit 400 is as follows.

When the fifth input terminal IN5 receives the (m−1)-th gate signal Gm−1, the fifth switching element TR5 is turned on. Thus, the fourth node N4 is applied to a divided voltage that is a voltage between the first and second clock signals CK and CKB having the high level applied to the first or second clock terminal CK1 or CK2, and the off voltage VOFF. When the divided voltage is lower than the threshold voltage of the sixth switching element TR6, the sixth switching element TR6 is turned off. The first node N1 of the m-th stage SRCm and the first node N1 of the (m+1)-th stage SRCm+1 are electrically disconnected from each other.

When the first input terminal IN1 or the second input terminal IN2 receives the high level of the m-th gate signal Gm or the (m+1)-th gate signal Gm+1, the sixth switching element TR6 is turned off. The first node N1 of the m-th stage SRCm and the first node N1 of the (m+1)-th stage SRCm+1 are electrically disconnected from each other.

That is, while the first, second and fifth input terminals IN1, IN2 and IN5 receive the high level of the m-th, (m+1)-th and (m−1)-th gate signals Gm, Gm+1 and Gm−1, the first node N1 of the m-th stage SRCm and the first node N1 of the (m+1)-th stage SRCm+1 are electrically disconnected from each other.

However, while the first, second and fifth input terminals IN1, IN2 and IN5 receive the low level of the m-th, (m+1)-th and (m−1)-th gate signals Gm, Gm+1 and Gm−1, the sixth switching element TR6 is turned on in response to the high level of the first and second clock signals CK and CKB. The high level of the first and second clock signals CK and CKB are alternately input into the first and second clock terminals CK1 and CK2. Thus, the first node N1 of the m-th stage SRCm and the first node N1 of the (m+1)-th stage SRCm+1 are electrically connected to each other.

As a result, when the first node N1 of the m-th stage SRCm has the high level, the first node N1 of the m-th stage SRCm and the first node N1 of the (m+1)-th stage SRCm+1 are electrically disconnected from each other. Thus, the m-th stage SRCm outputs the m-th gate signal Gm having the high level. When the first node N1 of the m-th stage SRCm has the low level that is the off voltage VOFF, the first node N1 of the m-th stage SRCm and the first node N1 of the (m+1)-th stage SRCm+1 are electrically connected. Thus, the noise components that are opposite in phase generated at the first node N1 of the m-th stage SRCm and the first node N1 of the (m+1)-th stage SRCm+1 may interfere with and cancel out each other.

A time for raising the signal of the first node N1 from low level to the high level is quicker by about ½ H than a time for outputting the m-th gate signal from the m-th stage SRCm. The voltage of the fourth node N4 falls to a voltage lower than the threshold voltage of the sixth switching element TR6 in response to the (m−1)-th gate signal Gm−1 having the high level. Thus, the first node N1 is stabilized at the off voltage VOFF.

Figure 9A:
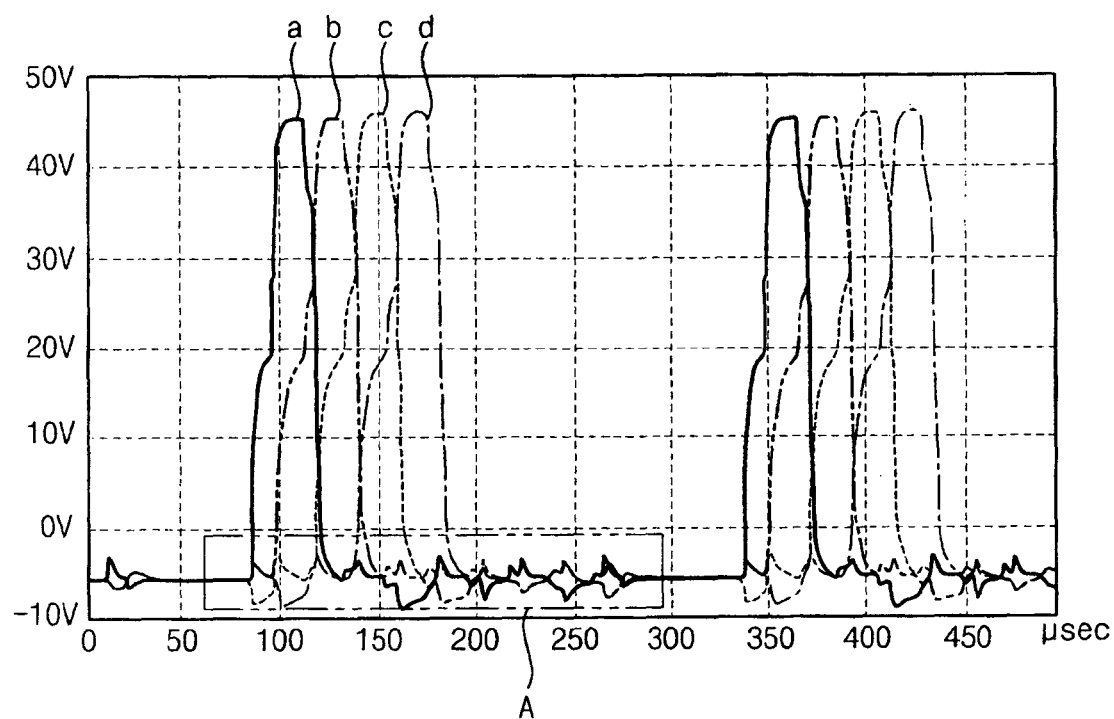
FIG. 9A is a timing diagram of signals applied to a first node of FIG. 2.
Figure 9B:
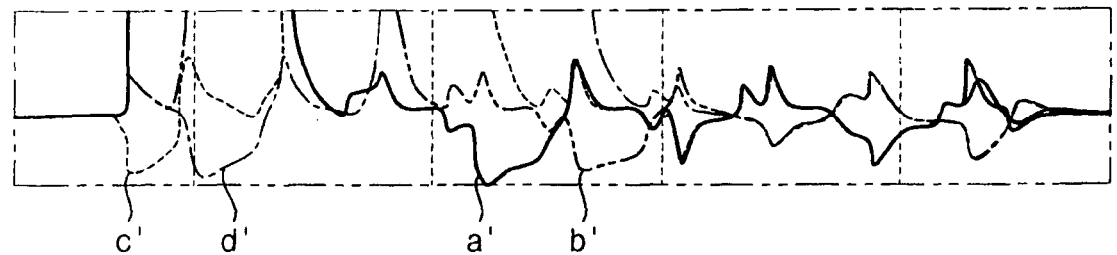
FIG. 9B is an enlarged timing diagram of a portion "A" of FIG. 9A.

FIG. 9A is a timing diagram of signals applied to a first node N1 of FIG. 2. FIG. 9B is an enlarged timing diagram of a portion "A" of FIG. 9A.

Referring to FIG. 9A, each of signals a, b, c and d detected from four sequential stages are illustrated. For example, at the first node N1 of the first and third stages that generated a gate signal in response to the first clock signal CK, the first signal a and the third signal c were detected. At the first node N1 of the second and fourth stages that generated a gate signal in response to the second clock signal CKB opposite in phase to the first clock signal CK, the second signal b and the fourth signal d were detected.

Referring to FIG. 9B, a phase difference between noise a' and c' including the first and the third signals a and c generated in response to the first clock signal CK, and noise b' and d' including the second and the fourth signals b and d generated in response to the second clock signal CKB was 180°.

According to the switching circuit of the present invention, the first noise a' interferes with the second noise b' having the phase difference of 180° in relation to the first noise a', so that the first and second noise components a' and b' may be removed. Also, the third noise c' interferes with the fourth noise d' having the phase difference of 180° in relation to the third noise a', so that the third and fourth noise components c' and d' may be removed.

As mentioned above, according to an example embodiment of the present invention, a control terminal of a pull-up section of an odd-numbered stage and a control terminal of a pull-up section of an even-numbered stage are electrically disconnected during a period when the first node of the odd-numbered stage and the even-numbered stage is changed to a high level, and connected during a period when the first node of the odd-numbered stage and the even-numbered stage maintains a low level.

Therefore, noise of the control terminal of the pull-up section may be removed, particularly, at a high temperature. The noise of the control terminal of the pull-up section may be decreased, so that noise of a gate signal may be removed. Thus, display quality may be enhanced.

Having described the example embodiments of the present invention and its advantage, it is noted that various changes, substitutions and alterations can be made herein without departing from the spirit and scope of the invention as defined by appended claims.

What is claimed is:

1. A gate driving circuit comprising:
   an m-th stage(wherein 'm' is an integer) comprising a pull-up section including a switch having a first control terminal receiving a first clock signal at a first terminal and outputting an m-th gate signal at a second terminal;
   an (m+1)-th stage connected to the m-th stage, the (m+1)-th stage comprising a pull-up section including a switch having a second control terminal receiving a second clock signal at a third terminal and outputting an (m+1)-th gate signal at a fourth terminal, wherein the second clock signal is opposite in phase to the first clock signal; and
   a noise removing circuit electrically disconnecting the first control terminal of the pull-up section of the m-th stage and the second control terminal of the pull-up section of the (m+1)-th stage in response to the m-th gate signal and the (m+1)-th gate signal and electrically connecting the first control terminal of the pull-up section of the m-th stage and the second control terminal of the pull-up section of the (m+1)-th stage in response to the first and second clock signals.

2. The gate driving circuit of claim 1, wherein the noise removing circuit comprises:
   a first switching circuit configured to receive the first clock signal or the second clock signal;
   a second switching circuit configured to receive the m-th gate signal or the (m+1)-th gate signal; and
   a third switching circuit configured to switch between the first control terminal of the pull-up section of the m-th stage and the second control terminal of the pull-up section of the (m+1)-th stage in response to an output signal of the first switching circuit and an output signal of the second switching circuit.

3. The gate driving circuit of claim 2, wherein the first switching circuit includes:
   a first switching element configured to output the first clock signal at a high level in response to receiving the first clock signal at the high level; and
   a second switching element configured to output the second clock signal at the high level in response to receiving the second clock signal at the high level.

4. The gate driving circuit of claim 2, wherein the second switching circuit includes:
   a third switching element configured to output the first clock signal at a level of an off voltage in response to receiving the m-th gate signal at a high level; and
   a fourth switching element configured to output the second clock signal at the level of the off voltage in response to receiving the (m+1)-th gate signal at the high level.

5. The gate driving circuit of claim 4, wherein the third switching circuit is configured to electrically disconnect the first control terminal of the pull-up section of the m-th stage and the second control terminal of the pull-up section of the (m+1)-th stage in response to the off voltage when the third switching element or fourth switching element is/are turned on, and
   electrically connect the first control terminal of the pull-up section of the m-th stage and the second control terminal of the pull-up section of the (m+1)-th stage in response to the first clock signal or second clock signal provided from the first switching element or second switching element when the third switching element and fourth switching element are turned off.

6. The gate driving circuit of claim 2, wherein the second switching circuit includes:
   a third switching element configured to output the first clock signal at a level of an off voltage in response to receiving the m-th gate signal at a high level;
   a fourth switching element configured to output the second clock signal at the level of the off voltage in response to receiving the (m+1)-th gate signal at the high level; and
   a fifth switching element configured to output the first clock signal at the level of the off voltage in response to receiving an (m−1)-th gate signal at the high level.

7. A display device comprising:
   a display panel comprising a display area displaying an image and a peripheral area surrounding the display area, a plurality of pixel areas being formed in the display area, and gate lines and data lines crossing the gate lines;
   a source driving circuit configured to output data signals to the data lines; and
   a gate driving circuit directly integrated in the peripheral area, and configured to output gate signals to the gate lines,
   wherein the gate driving circuit comprises:
   an m-th stage(wherein 'm' is an integer) comprising a pull-up section including a switch having a first control terminal receiving a first clock signal at a first terminal and outputting an m-th gate signal at a second terminal;

an (m+1)-th stage connected to the m-th stage, the (m+1)-th stage comprising a pull-up section including a switch having a second control terminal receiving a second clock signal at a third terminal and outputting an (m+1)-th gate signal at a fourth terminal, wherein the second clock signal is opposite in phase to the first clock signal; and a noise removing circuit electrically disconnecting the first control terminal of the pull-up section of the m-th stage and the second control terminal of the pull-up section of the (m+1)-th stage in response to the m-th gate signal and the (m+1)-th gate signal and electrically connecting the first control terminal of the pull-up section of the m-th stage and the second control terminal of the pull-up section of the (m+1)-th stage in response to the first and second clock signals.

8. The display device of claim 7, wherein the noise removing circuit comprises:

a first switching circuit configured to receive the first clock signal or the second clock signal;

a second switching circuit configured to receive the m-th gate signal or the (m+1)-th gate signal; and a third switching circuit configured to switch between the first control terminal of the pull-up section of the m-th stage and the second control terminal of the pull-up section of the (m+1)-th stage in response to an output signal of the first switching circuit and an output signal of the second switching circuit.

9. The display device of claim 8, wherein the first switching circuit comprises:

a first switching element configured to output the first clock signal at a high level in response to receiving the first clock signal at the high level; and a second switching element configured to output the second clock signal at the high level in response to receiving the second clock signal at the high level.

10. The display device of claim 8, wherein the second switching circuit comprises:

a third switching element configured to output the first clock signal at a level of an off voltage in response to receiving the m-th gate signal at a high level; and a fourth switching element configured to output the second clock signal at the level of the off voltage in response to receiving the (m+1)-th gate signal at the high level.

11. The display device of claim 10, wherein the third switching circuit is configured to electrically disconnect the first control terminal of the pull-up section of the m-th stage and the second control terminal of the pull-up section of the (m+1)-th stage in response to the off voltage when the third switching element or fourth switching element is/are turned on, and electrically connect the first control terminal of the pull-up section of the m-th stage and the second control terminal of the pull-up section of the (m+1)-th stage in response to the first clock signal or second clock signal provided from the first switching element or second switching element when the third switching element and fourth switching element are turned off.

12. The display device of claim 8, wherein the second switching circuit comprises:

a third switching element configured to output the first clock signal at a level of an off voltage in response to receiving the m-th gate signal at a high level;

a fourth switching element configured to output the second clock signal at the level of the off voltage in response to receiving the (m+1)-th gate signal at the high level; and a fifth switching element configured to output the first clock signal at the level of the off voltage in response to receiving an (m−1)-th gate signal at the high level.

* * * * *